(12) United States Patent
Laskaris et al.

(10) Patent No.: US 6,198,371 B1
(45) Date of Patent: Mar. 6, 2001

(54) OPEN MAGNET WITH FLOOR MOUNT

(75) Inventors: Evangelos Trifon Laskaris, Niskayuna; Yu Wang, Clifton Park; James Pellegrino Alexander, Ballston Lake, all of NY (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 09/436,828

(22) Filed: Nov. 9, 1999

(51) Int. Cl.$^7$ ........................................................ H01F 5/00
(52) U.S. Cl. ............................................. 335/299; 335/216
(58) Field of Search ........................... 335/216, 299–301; 324/318–321; 505/883

(56) References Cited

U.S. PATENT DOCUMENTS

| | | | |
|---|---|---|---|
| 4,622,824 | * 11/1986 | Creedon | 62/55 |
| 5,237,300 | * 8/1993 | Ige et al. | 335/299 |
| 5,291,169 | * 3/1994 | Ige et al. | 335/216 |
| 5,410,287 | 4/1995 | Laskaris et al. | 335/216 |
| 5,448,214 | * 9/1995 | Laskaris | 335/301 |
| 5,521,571 | 5/1996 | Laskaris et al. | 335/216 |
| 5,563,566 | * 10/1996 | Laskaris et al. | 335/216 |
| 5,883,558 | 3/1999 | Laskaris et al. | 335/216 |
| 5,963,117 | * 10/1999 | Ohashi et al. | 335/306 |
| 6,011,456 | * 1/2000 | Eckels et al. | 335/300 |

* cited by examiner

*Primary Examiner*—Lincoln Donovan
*Assistant Examiner*—Tuyen T. Nguyen
(74) *Attorney, Agent, or Firm*—Marvin Snyder; Douglas E. Stoner

(57) ABSTRACT

A vertically-aligned open magnet includes first and second (i.e., top and bottom) assemblies each having a longitudinally-extending and vertically-aligned axis, a superconductive main coil, and a vacuum enclosure enclosing the main coil. At least one support beam has a first end attached to the first assembly and has a second end attached to the second assembly. An annularly-cylindrical support skirt is coaxially aligned with the axes, has a first longitudinal end attached to the second assembly and has a second longitudinal end supportable by a floor.

20 Claims, 2 Drawing Sheets

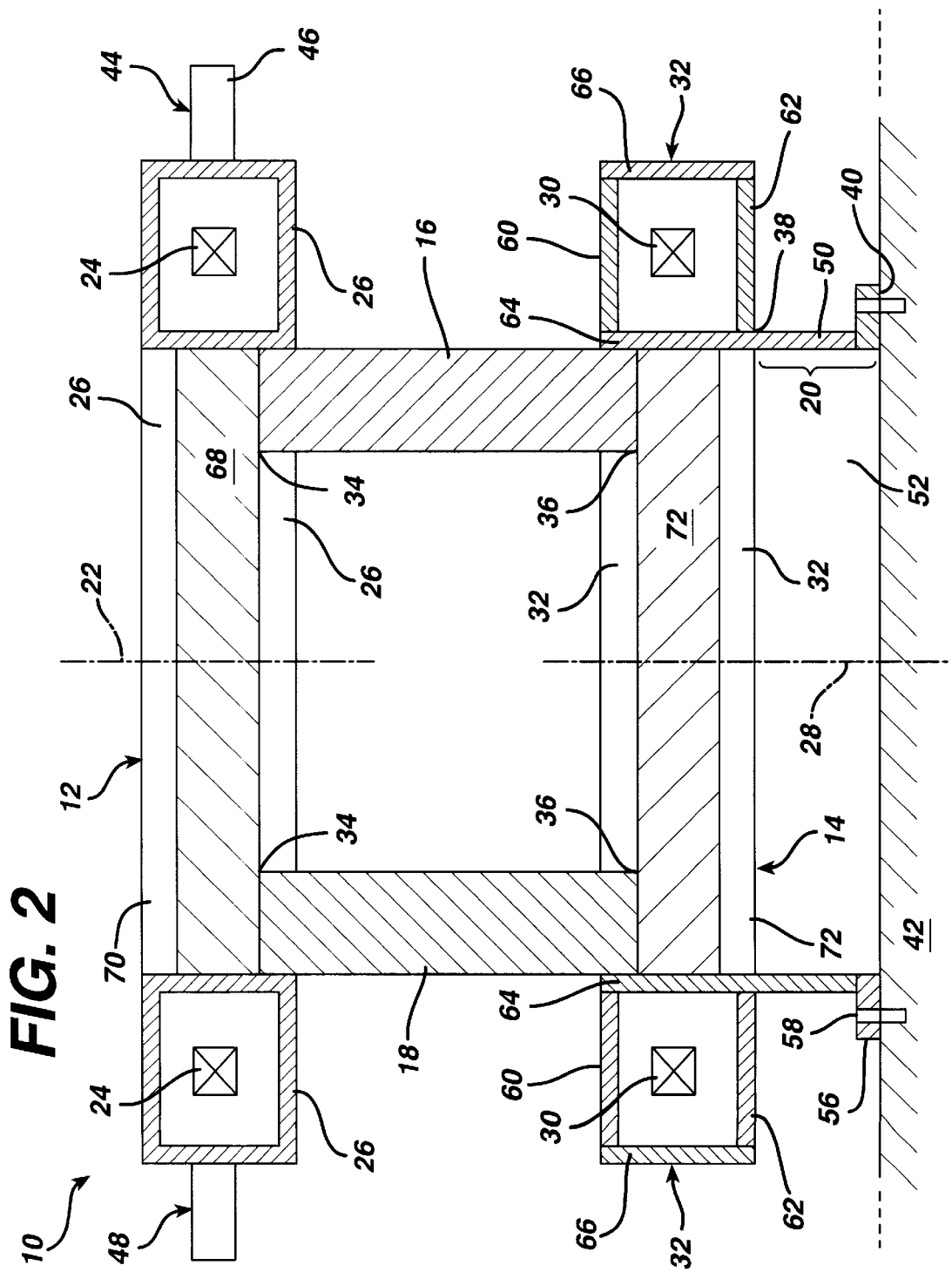

OPEN MAGNET WITH FLOOR MOUNT

BACKGROUND OF THE INVENTION

The present invention relates generally to open magnets, and more particularly to an open magnet having a floor mount.

Magnets include resistive and superconductive magnets which are part of a magnetic resonance imaging (MRI) system used in various applications such as medical diagnostics. Known superconductive magnets include liquid-helium-cooled, cryocooler-cooled, and hybrid-cooled superconductive magnets. Typically, the superconductive coil assembly includes a superconductive main coil surrounded by a thermal shield surrounded by a vacuum enclosure. A cryocooler-cooled magnet typically also includes a cryocooler coldhead externally mounted to the vacuum enclosure, having its first stage in solid conduction thermal contact with the thermal shield, and having its second stage in solid conduction thermal contact with the superconductive main coil. A liquid-helium-cooled magnet typically also includes a liquid-helium vessel surrounding the superconductive main coil with the thermal shield surrounding the liquid-helium vessel. A hybrid-cooled magnet uses both liquid helium (or other liquid or gaseous cryogen) and a cryocooler coldhead, and includes designs wherein the first stage of the cryocooler coldhead is in solid conduction thermal contact with the thermal shield and wherein the second stage of the cryocooler coldhead penetrates the liquid-helium vessel to recondense "boiled-off" helium.

Known resistive and superconductive magnet designs include closed magnets and open magnets. Closed magnets typically have a single, tubular-shaped resistive or superconductive coil assembly having a bore. The coil assembly includes several radially-aligned and longitudinally spaced-apart resistive or superconductive main coils each carrying a large, identical electric current in the same direction. The main coils are thus designed to create a magnetic field of high uniformity within a typically spherical imaging volume centered within the magnet's bore where the object to be imaged is placed.

Open magnets, including "C" shape and support-post magnets, typically employ two spaced-apart coil assemblies with the space between the assemblies containing the imaging volume and allowing for access by medical personnel for surgery or other medical procedures during magnetic resonance imaging. The patient may be positioned in that space or also in the bore of the toroidal-shaped coil assemblies. The open space helps the patient overcome any feelings of claustrophobia that may be experienced in a closed magnet design.

It is also known in open magnet designs to place an iron pole piece in the bore of a resistive or superconductive coil assembly. The iron pole piece enhances the strength of the magnetic field and, by shaping the surface of the pole piece, magnetically shims the magnet improving the homogeneity of the magnetic field. Nonmagnetizable support posts are connected to the face of the pole pieces. It is additionally known in horizontally-aligned open magnets to support the magnet on the floor using two spaced-apart feet attached to each assembly, such feet raising the assemblies to provide room underneath the assemblies for necessary wires, pipes, etc.

The sharpness of an MRI image depends, in part, on the magnetic field in the imaging volume being time-constant and highly uniform, such magnetic field suffering time and spatial deformation caused by vibrations, especially vibrations imparted to the coil assemblies of an open magnet by the presence of a cryocooler coldhead. What is needed is a design for a superconductive open magnet which reduces vibrations and hence which improves the sharpness of an MRI image.

BRIEF SUMMARY OF THE INVENTION

In a first expression of an embodiment of the invention, a open magnet includes first and second assemblies, at least one support beam, and a support skirt. Each assembly includes a longitudinally-extending axis, at least one superconductive main coil generally coaxially aligned with the axis, and a vacuum enclosure enclosing the assembly's at least one main coil. The first axis of the first assembly is generally vertically aligned, the second assembly is positioned generally vertically below the first assembly, and the second axis of the second assembly is generally coaxially aligned with the first axis. The at least one support beam has a first end attached to the first assembly and has a second end attached to the second assembly. The support skirt is a generally longitudinally-extending, annularly-cylindrical support skirt which is generally coaxially aligned with the second axis, which has a first longitudinal end attached to the second assembly, and which has a second longitudinal end which can be supported by a floor. In one example, the open magnet also includes a first cryocooler coldhead having a first housing attached to one of the first and second vacuum enclosures.

In a second expression of an embodiment of the invention, an open magnet includes first and second assemblies, nonmagnetizable first and second support beams, and a support skirt. Each assembly includes a longitudinally-extending axis, at least one superconductive main coil generally coaxially aligned with the axis, a vacuum enclosure enclosing the assembly's at least one main coil and surrounding a bore, and a magnet pole piece. The magnet pole piece is located inside the bore and outside the vacuum enclosure and is attached to the vacuum enclosure. The first axis of the first assembly is generally vertically aligned, the second assembly is positioned generally vertically below the first assembly, and the second axis of the second assembly is generally coaxially aligned with the first axis. The first and second support beams each are generally vertically aligned, each have a first longitudinal end attached to the first magnet pole piece of the first assembly, and each have a second longitudinal end attached to the second magnet pole piece of the second assembly. The support skirt is a generally longitudinally-extending, annularly-cylindrical support skirt which is generally coaxially aligned with the second axis, which has a first longitudinal end attached to the second assembly, and which has a second longitudinal end which can be supported by a floor. In one example, the open magnet also includes a first cryocooler coldhead having a first housing attached to the first vacuum enclosure.

Several benefits and advantages are derived from the invention. Engineering analysis shows that, compared to using conventional feet found on horizontally-aligned open magnets, the support-skirt design for a vertically-aligned open magnet stiffens the support of the magnet thereby shifting the natural frequency of the open magnet to a higher value which reduces the susceptibility of the open magnet to vibrate at the dominant low-excitation-frequencies imparted to the magnet by the presence of a cryocooler coldhead attached to an assembly (such as attached to a pole piece of an assembly). Applicants found that cryocooler vibrations cause vibration of the superconductive main coils, cause unwanted eddy-currents generated by vibrations of the thermal shields, and cause unwanted movement of the superconductive coils relative to the pole pieces all contributing to MRI image degradation. It is noted that, in a vertically-aligned open magnet, when the support member(s) provide a "clam-shell" support for the assemblies, the superconductive coils of such assemblies are subject to significant vibration from the cryocooler coldhead(s). It is further noted that a "clam-shell" support is provided by having only two support members, especially when the two support members are not diametrically aligned. Such clam-shell support is a very open support providing ease of patient table access to the imaging volume and providing ease of patient positioning within the imaging volume. Engineering analysis shows the support-skirt design of the invention reduces magnet vibrations in a vertically-aligned open magnet having a "clam-shell" support for the assemblies, especially for vibrations caused by the presence of a cryocooler coldhead.

BRIEF DESCRIPTION OF THE DRAWINGS

FIG. 2 is a cross-sectional view of the open magnet of FIG. 1 taken along lines 2—2 of FIG. 1 wherein the cryocooler coldheads are shown without hatching for clarity.

DETAILED DESCRIPTION OF THE INVENTION

Figure 1:
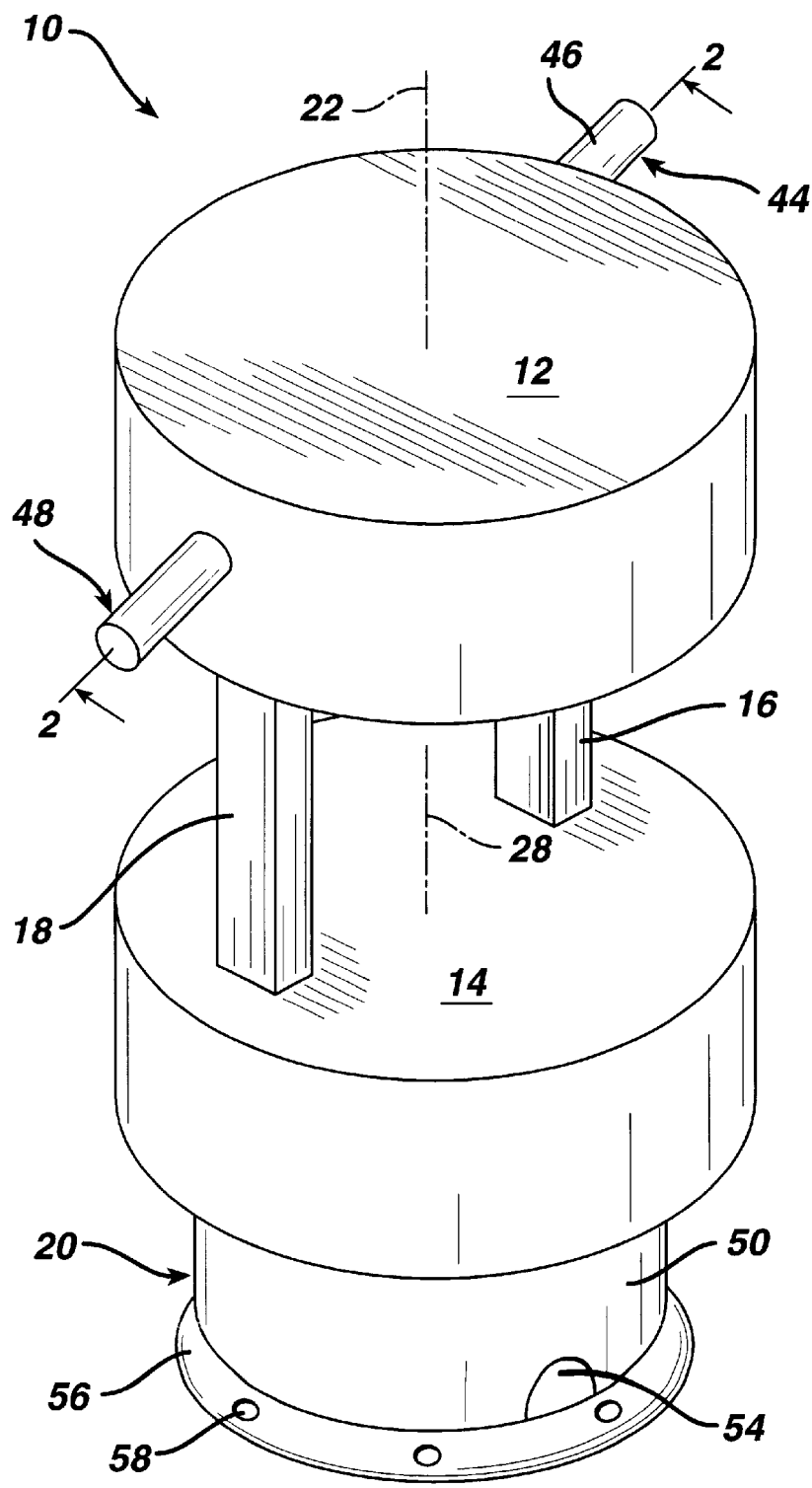
FIG. 1 is a schematic perspective view of an embodiment of an open magnet of the invention.

Referring now to the drawings, wherein like numerals represent like elements throughout, FIGS. 1–2 show an embodiment of the present invention. In a first expression of the embodiment of FIGS. 1–2 of the invention, an open magnet 10 includes a first assembly 12, a second assembly 14, at least one support beam 16 and 18, and a support skirt 20. The first assembly 12 has a longitudinally-extending and generally-vertically-aligned first axis 22, at least one superconductive main coil 24, and a first vacuum enclosure 26. By "generally-vertically-aligned" is meant vertically aligned plus or minus twenty degrees. The at least one superconductive main coil 24 of the first assembly 12 is generally coaxially aligned with the first axis 22 and carries a first main electric current in a first direction. The first direction is defined to be either a clockwise or a counterclockwise circumferential direction about the first axis 22 with any slight longitudinal component of current direction being ignored. The first vacuum enclosure 26 encloses the at least one superconductive main coil 24 of the first assembly 12. The second assembly 14 is longitudinally spaced apart from and disposed generally vertically below the first assembly 12. The second assembly 14 has a longitudinally-extending second axis 28, at least one superconductive main coil 30, and a second vacuum enclosure 32. The second axis 28 is generally coaxially aligned with the first axis 22. The at least one superconductive main coil 30 of the second assembly 14 is generally coaxially aligned with the second axis 28 and carries a second main electric current in the previously-described first direction. The second vacuum enclosure 32 encloses the at least one superconductive main coil 30 of the second assembly 14. The at least one support beam 16 and 18 has a first end 34 attached to the first assembly 12 and has a second end 36 attached to the second assembly 14. The support skirt 20 is a generally longitudinally-extending, annularly-cylindrical support skirt which is generally coaxially aligned with the second axis 28, which has a first longitudinal end 38 attached to the second assembly 14, and which has a second longitudinal end 40 supportable by a floor 42.

In one design, the open magnet 10 includes a first cryocooler coldhead 44 having a first housing 46 attached to one of the first and second vacuum enclosures 26 and 32. The first housing 46 is shown as horizontally-aligned and rigidly attached to the first vacuum enclosure 26 in the figures, but in another application (not shown) the first cryocooler is attached to the first vacuum enclosure by a flexible bellows attachment and receives total weight-bearing support from a separate and rigid support ceiling or floor mount, such attachments reducing cryocooler-induced vibration. Although omitted from the figures for clarity, typically the first cryocooler coldhead 44 includes first and second stages. The second stage is in solid conduction thermal contact with the at least one superconductive main coil, or the second stage acts as a recondenser of boiled-off liquid helium contained in a cryogenic vessel. The first stage is in solid conduction thermal contact with a thermal shield which generally surrounds the at least one superconductive main coil or which generally surrounds the cryogenic vessel containing the at least one superconductive main coil and which is itself surrounded by the first vacuum enclosure. In the application shown in the figures, there is added a second cryocooler coldhead 48 which is a single-stage cryocooler coldhead whose first stage (omitted from the figures for clarity) is in solid conduction thermal contact with the thermal shield of the first assembly. Here, the at least one superconductive main coil of the first assembly would be thermally connected to the at least one superconductive main coil of the second assembly, as can be appreciated by those skilled in the art.

In one example, the support skirt 20 provides the only weight-bearing support for the second assembly 14. In this example, the support skirt 20 has an annularly-cylindrical wall 50 surrounding an interior space 52, and the annularly-cylindrical wall 50 has at least one opening 54 allowing access to the interior space 52 for necessary wires, pipes, etc., as can be appreciated by the artisan. It is noted that although the annularly-cylindrical wall 50 has at least one opening 54, to maintain structural integrity to support the weight of the open magnet 10, the annularly-cylindrical wall 50 is never longitudinally split apart. Here, the support skirt 20 proximate its second longitudinal end 40 has a radially-outwardly-extending flange 56 having a plurality of generally vertically-extending bolt holes 58. Bolts (not shown in the figures) would attach the flange 56 to the floor 42 or to a plate or other structure resting on the floor.

In one construction, the second vacuum enclosure 32 has generally horizontally-aligned and generally planar and annular-shaped first and second walls 60 and 62 generally coaxially aligned with the second axis 28. The second vacuum enclosure 32 also has circumferentially-extending third and fourth walls 64 and 66. The first wall 60 is spaced apart from and disposed vertically above the second wall 62. The third wall 64 is spaced apart from and disposed radially inward from the fourth wall 66. The third and fourth walls 64 and 66 are each hermetically attached to both the first and second walls 60 and 62. In one design, the third wall 64 monolithically extends vertically below the second wall 62, and the third wall 64 vertically below the second wall 62 defines the annularly-cylindrical wall 50 of the support skirt 20.

In one application, the at least one support beam 16 and 18 is radially disposed proximate the support skirt 20. One type of "clam-shell" support for the first and second assemblies 12 and 14 is provided when the at least one support beam 16 and 18 consists of diametrically-offset first and second support beams 16 and 18. In one example, the first and second support beams 16 and 18 are radially disposed between generally 110 and 150 degrees apart.

In a second expression of the embodiment of FIGS. 1–2 of the invention, an open magnet 10 includes a first assembly 12, a second assembly 14, nonmagnetizable first and second support beams 16 and 18, and a support skirt 20. A support member is said to be a nonmagnetizable support member if it includes at least a nonmagnetizable portion which blocks having a magnetizable path between its ends. Such nonmagnetizable portion would have a relative permeability of generally unity. Examples of nonmagnetizable materials include aluminum, copper, nonmagnetic stainless steel, plastic, wood, etc. The first assembly 12 has a longitudinally-extending and generally-vertically-aligned first axis 22, at least one superconductive main coil 24, a first vacuum enclosure 26, and a first magnet pole piece 68. The at least one superconductive main coil 24 of the first assembly 12 is generally coaxially aligned with the first axis 22 and carries a first main electric current in a first direction. The first vacuum enclosure 26 encloses the at least one superconductive main coil 24 of the first assembly 12 and surrounds a first bore 70. The first magnet pole piece 68 is generally coaxially aligned with the first axis 22, is disposed inside the first bore 70 and outside the first vacuum enclosure 26, and is attached to the first vacuum enclosure 26. The second assembly 14 is longitudinally spaced apart from and disposed generally vertically below the first assembly 12. The second assembly 14 has a longitudinally-extending second axis 28, at least one superconductive main coil 30, a second vacuum enclosure 32, and a second magnet pole piece 72. The second axis 28 is generally coaxially aligned with the first axis 22. The at least one superconductive main coil 30 of the second assembly 14 is generally coaxially aligned with the second axis 28 and carries a second main electric current in the previously-described first direction. The second vacuum enclosure 32 encloses the at least one superconductive main coil 30 of the second assembly 14 and surrounds a second bore 74. The second magnet pole piece 72 is generally coaxially aligned with the second axis 28, is disposed inside the second bore 74 and outside the second vacuum enclosure 32, and is attached to the second vacuum enclosure 32 The first and second support beams 16 and 18 each are generally vertically aligned, each have a first end 34 attached to the first assembly 12 and each have a second end 36 attached to the second assembly 14. The support skirt 20 is a generally longitudinally-extending, annularly-cylindrical support skirt which is generally coaxially aligned with the second axis 28, which has a first longitudinal end 38 attached to the second assembly 14, and which has a second longitudinal end 40 supportable by a floor 42.

Options for the second expression of an embodiment of the open magnet 10 of the invention are the same as the optional designs, examples, constructions, and applications previously-described for the first expression of an embodiment of the open magnet 10 of the invention with differences hereinafter noted. In one design of the second expression of an embodiment of the open magnet 10 of the invention, the first cryocooler coldhead 44 has a first housing 46 which is attached to the first vacuum enclosure 26. In one example of the second expression of an embodiment of the open magnet 10 of the invention, the flange 56 of the support skirt 20 is attached (such as by welding) to the annularly-cylindrical wall 50 of the support skirt 20. In one construction, engineering calculations show an open magnet 10 weighing generally 18,000 pounds can have its second assembly 14 supported by a support skirt 20 wherein the third wall 64 of the second vacuum enclosure 32 (which below the second wall 62 defines the annularly-cylindrical wall 50 of the support skirt 20) comprises nonmagnetic stainless steel having a diameter of generally four feet and having a plate thickness of generally 0.25 to 0.50 inch with the first, second, and fourth walls requiring a thickness of generally 0.20 inch. It is noted that the stiffness of the first and second support beams 16 and 18 and the stiffness of the support skirt 20 can be chosen by those skilled in the art to reduce magnet vibration, such as cryocooler-imparted vibration, while providing structural support against gravitational and electromagnetic forces.

Several benefits and advantages are derived from the invention. Engineering analysis shows that, compared to using conventional feet found on horizontally-aligned open magnets, the support-skirt design for a vertically-aligned open magnet stiffens the support of the magnet thereby shifting the natural frequency of the open magnet to a higher value which reduces the susceptibility of the open magnet to vibrate at the dominant low-excitation-frequencies imparted to the magnet by the presence of a cryocooler coldhead attached to an assembly (such as attached to a pole piece of an assembly). Applicants found that cryocooler vibrations cause vibration of the superconductive main coils, cause unwanted eddy-currents generated by vibrations of the thermal shields, and cause unwanted movement of the superconductive coils relative to the pole pieces all contributing to MRI image degradation (including "ghosting" in images). It is noted that, in a vertically-aligned open magnet, when the support member(s) provide a "clam-shell" support for the assemblies, the superconductive coils of such assemblies are subject to significant vibration from the cryocooler coldhead(s). It is further noted that a "clam-shell" support is provided by having only two support members, especially when the two support members are not diametrically aligned. Such clam-shell support is a very open support providing ease of patient table access to the imaging volume and providing ease of patient positioning within the imaging volume. Engineering analysis shows the support-skirt design of the invention reduces magnet vibrations in a vertically-aligned open magnet having a "clam-shell" support for the assemblies, especially for vibrations caused by the presence of a cryocooler coldhead.

It should be noted that additional superconductive main coils, superconductive shielding coils, superconductive correction coils, and magnetizable rings may be present, as is known to the artisan, but such coils and rings have been omitted from the figures for clarity. Likewise, coil forms (if needed) to support the superconductive main coils and spacers to position a thermal shield with respect to a cryogenic vessel and to position a thermal shield with respect to a vacuum enclosure have been omitted from the figures but are well known to those skilled in the art. In an example, the open magnet 10 is a 0.5 or higher Tesla magnet, and the cryocooler coldheads are Gifford McMahon cryocooler coldheads.

The foregoing description of several expressions of an embodiment of the invention has been presented for purposes of illustration. It is not intended to be exhaustive or to limit the invention to the precise form disclosed, and obviously many modifications and variations are possible in light of the above teaching. It is intended that the scope of the invention be defined by the claims appended hereto.

What is claimed is:

1. An open magnet comprising:
   a) a first assembly including:
      (1) a longitudinally-extending and generally-vertically-aligned first axis;

(2) at least one superconductive main coil positioned around said first axis and carrying a first main electric current in a first direction; and
(3) a first vacuum enclosure enclosing said at least one superconductive main coil of said first assembly;
b) a second assembly longitudinally spaced apart from and disposed below said first assembly and including:
(1) a longitudinally-extending second axis generally coaxially aligned with said first axis;
(2) at least one superconductive main coil positioned around said second axis and carrying a second main electric current in said first direction; and
(3) a second vacuum enclosure enclosing said at least one superconductive main coil of second assembly;
c) at least one support beam external to said first and second vacuum enclosure having a first end attached to said first assembly and having a second end attached to said second assembly;
d) a longitudinally-extending, annularly-cylindrical support skirt positioned around said second axis, having a first longitudinal end attached to and external to said second assembly, and having a second longitudinal end supportable by a floor.

2. The open magnet of claim 1, also including a first cryocooler coldhead having a first housing attached to one of said first and second vacuum enclosures.

3. The open magnet of claim 1 wherein said support skirt is attached to the exterior of said second assembly and is the weight-bearing support for said second assembly.

4. The open magnet of claim 1, wherein said support skirt has an annularly-cylindrical wall surrounding an interior space, and wherein said annularly-cylindrical wall has at least one opening allowing access to said interior space.

5. The open magnet of claim 4, wherein said support skirt at its second longitudinal end has a radially-outwardly-extending flange having a plurality of generally vertically-extending bolt holes.

6. An open magnet comprising:
a) a first assembly including:
(1) a longitudinally-extending and generally-vertically-aligned first axis;
(2) at least one superconductive main coil positioned around said first axis and carrying a first main electric current in a first direction; and
(3) a first vacuum enclosure enclosing said at least one superconductive main coil of said first assembly;
b) a second assembly longitudinally spaced apart from and disposed generally vertically below said first assembly and including:
(1) a longitudinally-extending second axis positioned around said first axis;
(2) at least one superconductive main coil positioned around said second axis and carrying a second main electric current in said first direction; and
(3) a second vacuum enclosure enclosing said at least one superconductive main coil of second assembly;
c) at least one support beam having a first end attached to said first assembly and having a second end attached to said second assembly;
d) a longitudinally-extending, annularly-cylindrical support skirt generally-coaxially-aligned with said second axis, having a first longitudinal end attached to said second assembly, and having a second longitudinal end supportable by a floor;
wherein said support skirt has an annularly-cylindrical wall surrounding an interior space, and wherein said annularly-cylindrical wall has at least one opening allowing access to said interior space;
wherein said support skirt at its second longitudinal end has a radially-outwardly-extending flange having a plurality of generally vertically-extending bolt holes; and
wherein said second vacuum enclosure has horizontally-aligned and planar and annular-shaped first and second walls generally coaxially aligned with said second axis and has circumferentially-extending third and fourth walls, wherein said first wall is spaced apart from and disposed vertically above said second wall, wherein said third wall is spaced apart from and disposed radially inward from said fourth wall, and wherein said third and fourth walls are each hermetically attached to both said first and second walls.

7. The open magnet of claim 6, wherein said third wall monolithically extends vertically below said second wall, and wherein said third wall vertically below said second wall defines said annularly-cylindrical wall of said support skirt.

8. The open magnet of claim 1, wherein said at least one support beam is radially disposed contiguous to said support skirt.

9. The open magnet of claim 8, wherein said at least one support beam consists of diametrically-offset first and second support beams.

10. The open magnet of claim 9, wherein said first and second support beams are radially disposed between 110 and 150 degrees apart.

11. An open magnet comprising:
a) a first assembly including:
(1) a longitudinally-extending and vertical first axis;
(2) at least one superconductive main coil positioned around said first axis and carrying a first main electric current in a first direction;
(3) a first vacuum enclosure enclosing said at least one superconductive main coil of said first assembly and surrounding a first bore; and
(4) a first magnet pole piece generally coaxially aligned with said first axis, disposed inside said first bore and outside said first vacuum enclosure, and attached to said first vacuum enclosure;
b) a second assembly longitudinally spaced apart from and vertically below said first assembly and including:
(1) a longitudinally-extending second axis generally coaxially aligned with said first axis;
(2) at least one superconductive main coil positioned around said second axis and carrying a second main electric current in said first direction;
(3) a second vacuum enclosure enclosing said at least one superconductive main coil of said second assembly and surrounding a second bore; and
(4) a second magnet pole piece generally coaxially aligned with said second axis, disposed inside said second bore and outside said second vacuum enclosure, and attached to said second vacuum enclosure;
c) nonmagnetizable first and second support beams external to said first and second vacuum enclosure each generally-vertically-aligned, each having a first longitudinal end attached to said first magnet pole piece, and each having a second longitudinal end attached to said second magnet pole piece; and
d) a longitudinally-extending, annularly-cylindrical support skirt positioned around said second axis, having a first longitudinal end attached to and external to said second assembly, and having a second longitudinal end supportable by a floor.

12. The open magnet of claim 11, also including a first cryocooler coldhead having a first housing attached to said first vacuum enclosure.

13. The open magnet of claim 12 wherein said support skirt is attached to the exterior of said second assembly and is the weight-bearing support for said second assembly.

14. The open magnet of claim 13, wherein said support skirt has an annularly-cylindrical wall surrounding an interior space, and wherein said annularly-cylindrical wall has at least one opening allowing access to said interior space.

15. The open magnet of claim 14, wherein said support skirt at its second longitudinal end has a radially-outwardly-extending flange having a plurality of generally vertically-extending bolt holes.

16. An open magnet comprising:
    a) a first assembly including:
       (1) a longitudinally-extending and generally-vertically-aligned first axis;
       (2) at least one superconductive main coil positioned around said first axis and carrying a first main electric current in a first direction;
       (3) a first vacuum enclosure enclosing said at least one superconductive main coil of said first assembly and surrounding a first bore; and
       (4) a first magnet pole piece positioned around said first axis, disposed inside said first bore and outside said first vacuum enclosure, and attached to said first vacuum enclosure;
    b) a second assembly longitudinally spaced apart from and disposed below said first assembly and including:
       (1) a longitudinally-extending second axis generally coaxially aligned with said first axis;
       (2) at least one superconductive main coil positioned around said second axis and carrying a second main electric current in said first direction;
       (3) a second vacuum enclosure enclosing said at least one superconductive main coil of said second assembly and surrounding a second bore; and
       (4) a second magnet pole piece positioned around said second axis, disposed inside said second bore and outside said second vacuum enclosure, and attached to said second vacuum enclosure;
    c) nonmagnetizable first and second support beams each generally-vertically-aligned, each having a first longitudinal end attached to said first magnet pole piece, and each having a second longitudinal end attached to said second magnet pole piece;
    d) a longitudinal, annularly-cylindrical support skirt positioned around said second axis, having a first longitudinal end attached to said second assembly, and having a second longitudinal end supportable by a floor;

also including a first cryocooler coldhead having a first housing attached to said first vacuum enclosure;

wherein said support skirt supports said assembly;

wherein said support skirt has an annularly-cylindrical wall surrounding an interior space, and wherein said annularly-cylindrical wall has at least one opening allowing access to said interior space;

wherein said support skirt proximate its second longitudinal end has a radially-outwardly-extending flange having a plurality of vertically-extending bolt holes; and wherein said second vacuum enclosure has a horizontal disk shape and annularly-shaped first and second walls positioned around said second axis and has circumferentially-extending third and fourth walls, wherein said first walls is spaced apart from and disposed vertically above said second wall, wherein said third wall is spaced apart from and disposed radially inward from said fourth wall, and wherein said third and fourth walls are each hermetically attached to both said first and second walls.

17. The open magnet of claim 16, wherein said third wall monolithically extends vertically below said second wall, wherein said third wall vertically below said second wall defines said annularly-cylindrical wall of said support skirt, and wherein said flange of said support skirt is attached to said annularly-cylindrical wall of said support skirt.

18. The open magnet of claim 17, wherein said at least one support beam is radially disposed contiguous to said support skirt.

19. The open magnet of claim 18, wherein said at least one support beam consists of diametrically-offset first and second support beams.

20. The open magnet of claim 19, wherein said first and second support beams are radially disposed between generally 110 and 150 degrees apart.

* * * * *